(12) United States Patent
Blutman

(10) Patent No.: US 9,923,552 B2
(45) Date of Patent: Mar. 20, 2018

(54) LATCH CIRCUITRY

(71) Applicant: NXP B.V., Eindhoven (NL)

(72) Inventor: Kristof Laszlo Blutman, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/215,364

(22) Filed: Jul. 20, 2016

(65) Prior Publication Data
US 2018/0026610 A1 Jan. 25, 2018

(51) Int. Cl.
H03K 3/356 (2006.01)
H03K 3/012 (2006.01)
H03K 3/3562 (2006.01)

(52) U.S. Cl.
CPC ........... *H03K 3/012* (2013.01); *H03K 3/3562* (2013.01)

(58) Field of Classification Search
CPC .. H03K 3/35625; H03K 3/012; H03K 3/0372; H03K 3/0375
See application file for complete search history.

(56) References Cited

U.S. PATENT DOCUMENTS

| | | | |
|---|---|---|---|
| 6,630,853 B1 | 10/2003 | Hamada | |
| 6,822,478 B2 | 11/2004 | Elappuparackal | |
| 6,864,732 B2 | 3/2005 | Chalasani | |
| 7,772,905 B2 | 8/2010 | Yasuda et al. | |
| 7,772,906 B2 | 8/2010 | Naffziger | |
| 8,487,681 B2 | 7/2013 | Dally et al. | |
| 8,547,155 B2 | 10/2013 | Holst et al. | |
| 2003/0016148 A1* | 1/2003 | Zhang | H03K 3/356043 341/101 |
| 2012/0182056 A1 | 7/2012 | Dally et al. | |
| 2014/0368246 A1* | 12/2014 | Kim | H03K 3/0372 327/202 |
| 2015/0123722 A1 | 5/2015 | Sharma et al. | |
| 2015/0123723 A1 | 5/2015 | Sharma et al. | |
| 2016/0087611 A1 | 3/2016 | Sharma et al. | |

OTHER PUBLICATIONS

Kawaguchi, H. et al. "A Reduced Clock-Swing Flip-Flop (RCSFF) for 63% Power Reduction", IEEE Journal of Solid-State Circuits, vol. 33, No. 5, pp. 807-811 (May 1998).
Kawai, N. et al. "A Fully Static Topologically-Compressed 21-Transistor Flip-Flop With 75% Power Saving", IEEE Journal of Solid-State Circuits, vol. 49, No. 11, pp. 2526-2533 (Nov. 2014).

(Continued)

*Primary Examiner* — Sibin Chen

(57) ABSTRACT

Circuitry is configured to store data in response to a phase transition of an input clock. The circuitry uses a master-slave latch configuration. Each of the master and slave latches includes respective feedback circuits, input circuits, and selection circuits. The feedback circuits drive outputs of the respective latches to values that are responsive to data stored in the latches. The input circuits drive the output of the respective latches to values that are responsive to data on an input of the latches. The selection circuits select between the feedback and input circuits based upon the phase of a clock signal.

17 Claims, 6 Drawing Sheets

(56) References Cited

OTHER PUBLICATIONS

Levacq, D. et al. "Half $V_{DD}$ Clock-Swing Flip-Flop with Reduced Contention for up to 60% Power Saving in Clock Distribution", IEEE 33$^{rd}$ European Solid State Circuits Conference, 4 pgs. (Sep. 2007).
Kawai, N. et al. "A Fully Static Topologically-Compressed 21-Transistor Flip-Flop with 75% Power Saving", IEEE Asian Solid-State Circuits Conference, pp. 117-120 (Nov. 11, 2013).
Extended European Search Report for Patent Appln. No. 17178799.7 (Jan. 9, 2018).

* cited by examiner

LATCH CIRCUITRY

OVERVIEW

Aspects of various embodiments are directed to latch circuitry that stores data in response to a phase transition of an input clock.

Various different types of electronic circuits and systems rely on synchronous logic that includes flip-flops and latches that store data synchronous to a control (clock) signal. The power drawn by these components can be an important consideration in devices that use a large number of flip-flops and latches, such as certain types of programmable logic devices. The total energy dissipated by such synchronous elements has often been as a function of the amount of energy that is consumed each time that the stored data changes value.

These and other matters have presented challenges to efficiencies of flip-flop and latched-based circuit implementations, for a variety of applications.

SUMMARY

Various example embodiments are directed to issues such as those addressed above and/or others which may become apparent from the following disclosure concerning flip-flop circuitry that is implemented using master and slave latches.

In certain embodiments, aspects of the present disclosure involve flip-flop circuitry that reduces power consumption by limiting power draw from clock transitions.

According to some embodiments, circuitry is configured to store data in response to a phase transition of an input clock. The circuitry includes a master latch. The master latch includes: a master feedback circuit configured to drive an output of the master latch to a value that is responsive to data stored in the master latch; a master input circuit configured to drive the output of the master latch to a value that is responsive to data on an input of the master latch; and a master selection circuit. The master selection circuit is configured to: select, in response to a first phase of the input clock, the master input circuit to drive the output of the master latch; and select, in response to a second phase of the input clock, the master feedback circuit to drive the output of the master latch. The circuitry includes a slave latch with a slave feedback circuit configured to drive an output of the slave latch to a value that is responsive to data stored in the slave latch; a slave input circuit configured to drive the output of the slave latch to a value that is responsive to data on the output of the master latch; and a slave selection circuit. The slave selection circuit is configured to: select, in response to the second phase of the input clock, the slave input circuit to drive the output of the master latch; and select, in response to the first phase of the input clock, the master feedback circuit to drive the output of the master latch.

In various embodiments, a method is provided that involves operating circuitry that includes a master latch circuit and a slave latch circuit. The operation of the circuitry includes enabling, in response a first clock phase of an input clock and using a master selection circuit of the master latch circuit, a master input circuit; driving, using the enabled master input circuit, an output of the master latch circuit to a value that is responsive to data present on an input to the master latch circuit; disabling, in response the first clock phase of the input clock and using a slave selection circuit of the slave latch circuit, a slave input circuit; maintaining, using a slave feedback circuit of the slave latch circuit, an output of the slave latch circuit; disabling, in response a second clock phase of the input clock and using the master selection circuit, the master input circuit; maintaining, using a master feedback circuit of the master latch circuit, the output of the master latch circuit; enabling, in response the second clock phase of the input clock and using the slave selection circuit, the slave input circuit; and driving, using the enabled slave input circuit, the output of the slave latch circuit to a value that is responsive to a value present on the output of the master latch circuit.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
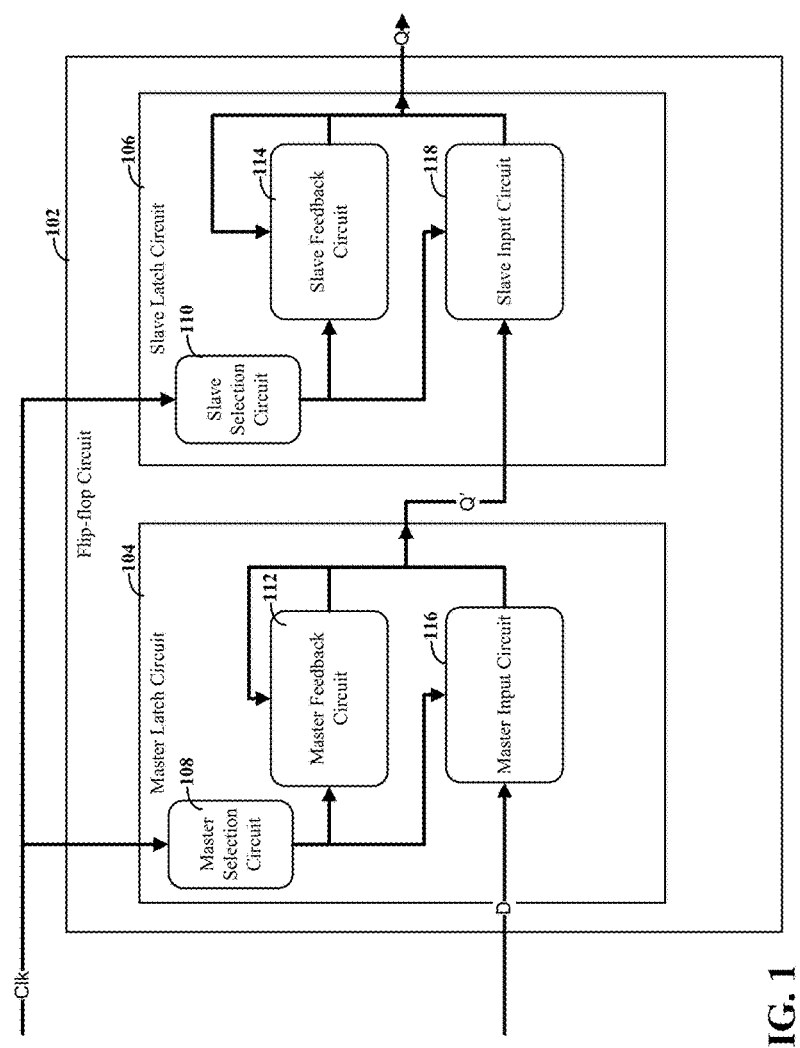
FIG. 1 is a block diagram of a flip-flop circuit, consistent with embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving synchronously-clocked latches. In certain implementations, aspects of the present disclosure have been shown to be beneficial when used in the context of circuits that use flip-flops as part of synchronous logic. In some embodiments, the flip-flops conserve energy by preventing internal nodes from changing state when the clock changes state and the data remain unchanged. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various embodiments of the present disclosure are directed towards a flip-flop circuit that uses a combination of a master latch at the input and a slave latch at the output. The master latch is configured to be transparent for data received on an input to the flip-flop when the clock is in a first phase or state (e.g., either low or high). An internal node connects an output of the master latch to an input of the slave latch. The slave latch is configured to be transparent for data received on the internal node when the clock is in a second phase (the other of low or high). Consistent with particular implementations, the master and slave latches are designed to maintain the states of internal nodes until and unless input data changes. This can be particularly useful for providing low power draw due to changes in clock phase (in the absence of changes to the input data).

According to particular embodiments, each of the master and slave latch circuits include respective feedback and input circuits, each of which can drive the output of the respective latch circuits in response to the state of different nodes within the flip-flop. The feedback circuits are responsive to the present output value of the latch circuit. The input circuits are responsive to the present input value of the latch circuit. A selection circuit determines whether the feedback circuit or the latch circuit drive the output of a corresponding latch.

Consistent with various embodiments, the selection circuit receives a single-ended clock signal and provides the selection function without the use of a separate clock buffer circuit. Moreover, a change between the selected circuits does not result in a state change in the internal nodes of the corresponding latch in the absence of a change in the input data provided to the latch.

Various aspects of the present disclosure can be useful for low dynamic power in a flip-flop circuit. The dynamic power can be low due to the flip-flop cell using only a single clock signal, as opposed to multiple clock signals with different phases. The use of a single clock signal can be particularly useful for reducing power drawn by clock buffers (inverters) used to generate another clock signal from the input clock. The dynamic power can also be kept low due to a flip-flop cell that does not change the states for internal nodes until and unless the input data changes. This allows for the current draw relating to clock phase changes to be relatively low.

Turning now to the figures, FIG. 1 is a block diagram of a flip-flop circuit, consistent with embodiments of the present disclosure. The flip-flop circuit 102 includes a data input "D," a clock input "Clk," and a data output "Q." The flip-flop circuit 102 can be used in connection with a number of different systems and devices. As discussed herein, the flip-flop circuit 102 may be configured for relatively low power consumption. Thus, systems and devices that use a large number of flip-flops (e.g., large SoC or PLD devices) may find the flip-flop circuit to be particularly beneficial.

The flip-flop circuit 102 can be used in various other contexts (e.g., devices with few, or even a single, flip flop circuits).

The flip-flop circuit 102 is depicted with a master latch circuit 104 and a slave latch circuit 106. The master latch circuit 104 passes data received on the flip-flop input D to an internal node Q' when the clock signal Clk is in a first phase (e.g., low). Slave latch circuit 106 passes data received on the internal node Q' to an output node Q when the clock signal is in a second phase (e.g., high). The master latch circuit 104 maintains (stores) the output data when the clock signal Clk is in the second phase. The slave latch circuit 106 maintains (stores) the output data. The effect of this configuration is that a change in the input D appears on the output Q after the clock transitions from the first phase to the second phase. Thus, the flip-flop circuit 102 operates as a single-edge triggered flip-flop.

According to various embodiments, the master latch circuit includes a master feedback circuit 112. When selected, the master feedback circuit 112 drives the internal node Q' to a value (state) that is responsive to the value already present on the internal node Q'. The master feedback circuit 112 maintains this output independent from a change of the value on the flip-flop input D. When selected, the master input circuit 116 drives the internal node Q' to a value that is responsive to the value on the input D and independent from the prior value of the internal node Q'. Master selection circuit 108 controls whether the master feedback circuit 112 or the master input circuit 116 actively drives the internal node Q'. In particular, the master input circuit 116 is selected in response to a first phase of the clock signal Clk. The master selection circuit 108 selects the master feedback circuit 112 in response to a second phase of the clock signal Clk.

The slave latch circuit includes a slave feedback circuit 114 that, when selected, drives the output node Q to a value that is responsive to the value already present on the output node Q and independently from the value on the internal node Q'. The slave input circuit 118, when selected, drives the output node Q to a value that is responsive to the value on the internal node Q' and independent from the prior value on the output node Q. Slave selection circuit 110 controls whether the slave feedback circuit 114 or the slave input circuit 118 actively drives the output node Q. In particular, the slave selection circuit 110 selects the slave feedback circuit 114 in response to the first phase of the clock signal Clk. The slave selection circuit 110 selects the slave input circuit 118 in response to the second phase of the clock signal Clk.

Consistent with various embodiments of the present disclosure, the master and slave selection circuits 108, 110 are designed such that changing selections between the feedback and input circuits does not cause a change in state for any internal nodes, unless the input value D has changed from the previous clock period. Accordingly, the flip flop circuit 102 does not draw extra power from internal state changes due to clock phase changes (without accompanied changes to the input data).

Consistent with certain embodiments, the master and slave selection circuits 108, 110 are designed to directly respond to the clock signal Clk without the use of buffer circuits. For instance, a master-slave latch circuit might otherwise use a differential clock signal that is generated using an inverting buffer. A master-slave latch circuit might also use two clock signals that are offset in time using one or more buffer circuits. Such buffer circuits can consume power, particularly when the clock changes phase. Accordingly, the flip flop circuit 102 does not draw the power otherwise consumed by clock buffer circuits.

Figure 2:
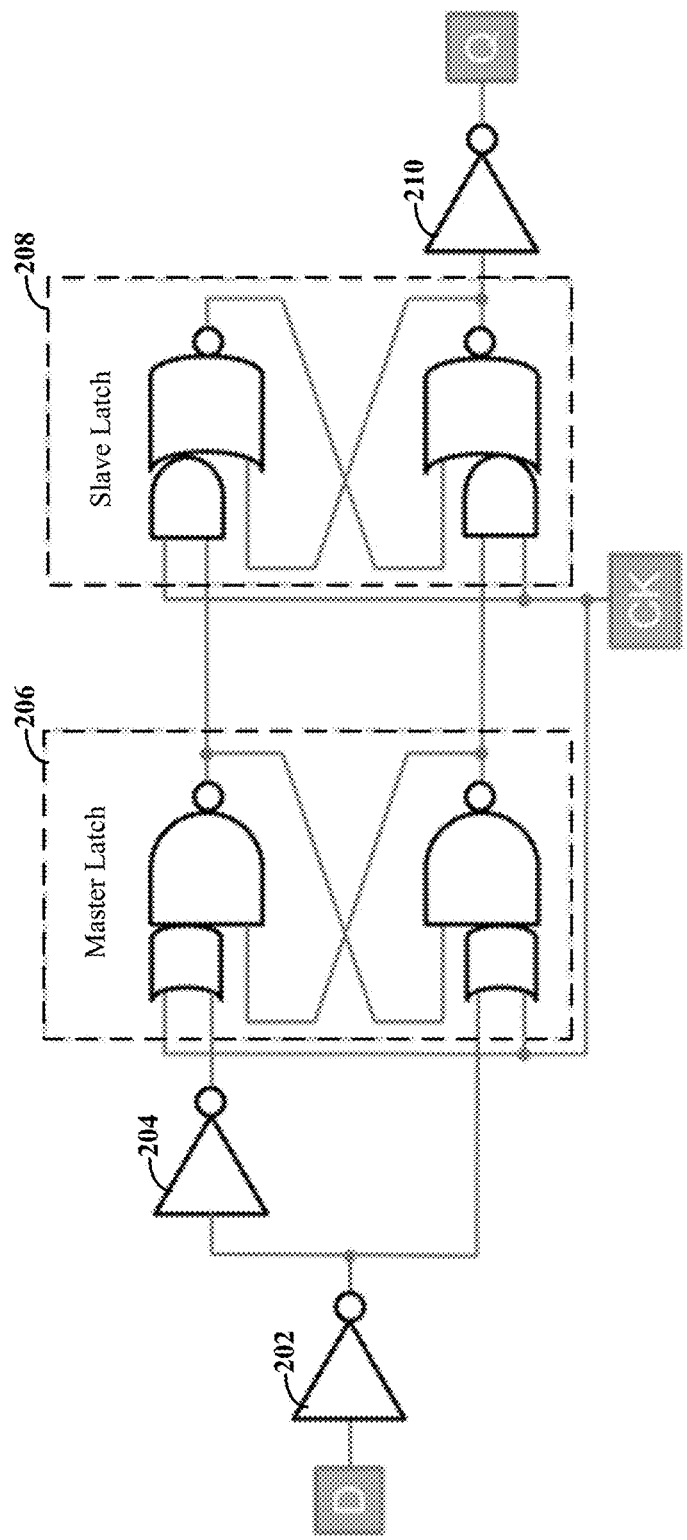
FIG. 2 is a circuit diagram for the binary logic of a flip-flop circuit, consistent with embodiments of the present disclosure.

FIG. 2 is a circuit diagram for the binary logic of a flip-flop circuit, consistent with embodiments of the present disclosure. The depicted binary logic represents the equivalent functionality to master and slave latches that are consistent with various embodiments and figures, including the previously discussed flip-flop circuit of FIG. 1. Master latch 206 is depicted as including cross-coupled NAND gates, where one output of each of the NAND gates is fed back as an input to the other NAND gate. The other input of each of the NAND gates is gated by a respective OR gate. Each OR gate is connected to the clock input (CK). Inverting buffers 202 and 204 produce a differential signal that represents the single-ended input (D). This allows for an input for one of the NOR gates, which is also connected to an inverter version of the input data (D) and an input for the other of the NOR gates is connected to a non-inverted version of the input data (D).

The function of the master latch 206 is to be transparent to the input data (D) when the clock input (CK) is in a first (low) phase. The master latch will also maintain (store) the value when the clock input (CK) is in a second (high) phase. In either situation, the output is provided as a differential output to the slave latch 208.

Slave latch 208 is depicted as including cross-coupled NOR gates, where one output of each of the NOR gates is fed back as an input to the other of the NOR gates. The other input of each of the NOR gates is gated by a respective AND gate. The clock input (CK) is connected to one input of each of the AND gates. The other input is connected to one of the differential signals from the output for the master latch 206. The output of the slave latch is buffered by inverting buffer 210 to produce the output (Q) of the flip-flop circuit.

The function of the slave latch 208 is to be transparent to the differential output of the master latch when the clock input (CK) is in the second (high) phase. The slave latch will also maintain (store) the data when the clock input (CK) is in the first (low) phase.

Various aspects of the present disclosure relate to the reduction in size of the transistor-level logic used to implement the master latch 206 and the slave latch 208. In particular, the transistors of the gating OR and AND gates are shared with the cross-coupled NAND and NOR gates, respectively. This results in a savings in both space and power for the corresponding circuit.

Figure 3:
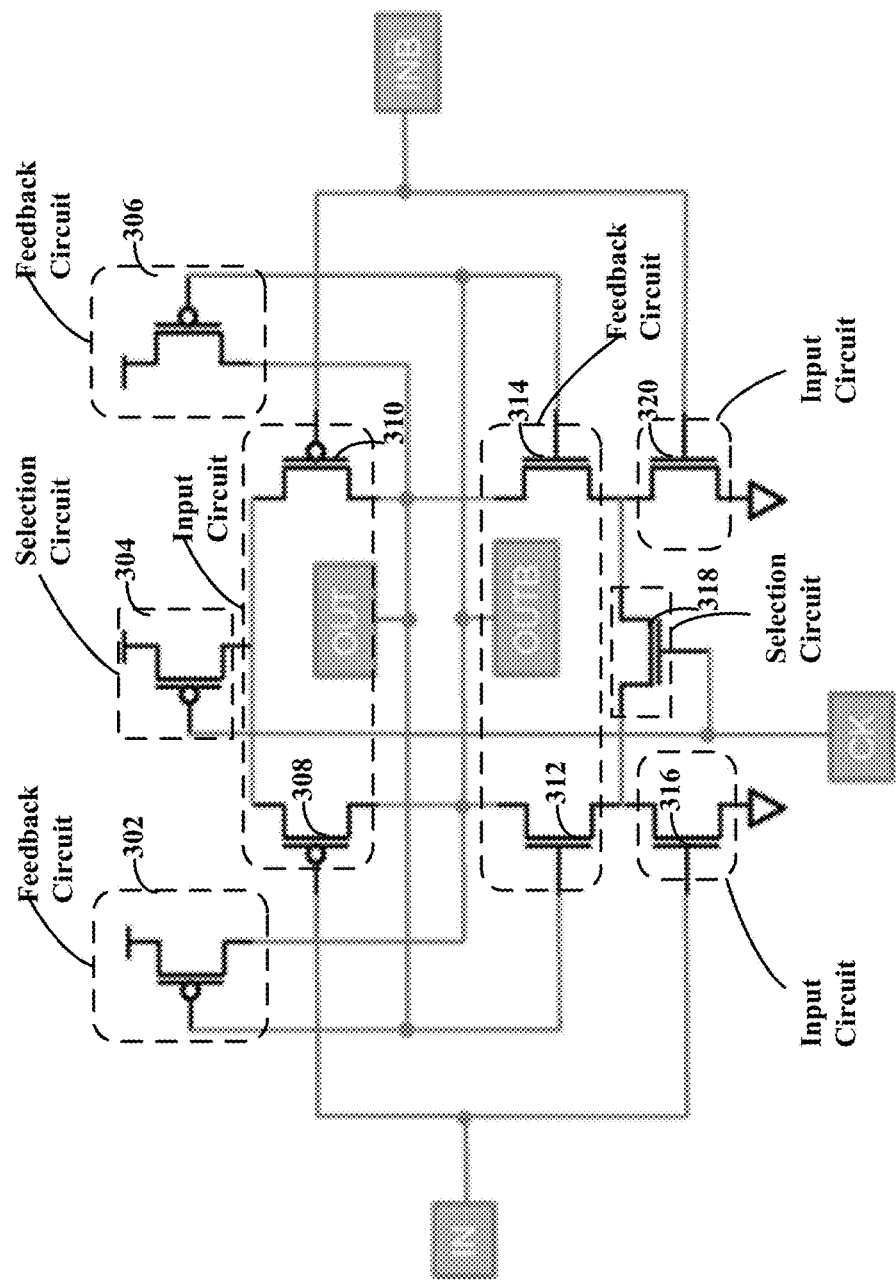
FIG. 3 is a transistor-level diagram for a master latch circuit, consistent with embodiments of the present disclosure.

FIG. 3 is a transistor-level diagram for a master latch circuit, consistent with embodiments of the present disclosure. Transistors 308, 310, 316, and 320 form the input circuit. Transistors 302, 306, 312, and 314 form the feedback circuit. Transistors 304 and 318 form the selection circuit. The selection circuit selects which of the input circuit and feedback circuit drive the differential output node OUT and OUTB in response to the clock signal (CK).

The input circuit transistors 316 and 320 serve as pull-downs that are controlled by different portions of the differential input signal formed by IN and INB. When the differential input signal is high (IN=1 and INB=0), transistor 316 is active and transistor 320 is not. The inverse is true when the differential input signal is low (IN=0 and INB=1). In an opposite fashion, input circuit transistors 308 and 310 serve as pull-ups that are controlled by the differential input signal. When the differential input signal is high (IN=1 and INB=0), transistor 310 is active and transistor 308 is not. The inverse is true when the differential input signal is low (IN=0 and INB=1).

The feedback transistors 312 and 314 serve as pull-downs that are controlled by different portions of the differential output signal formed by OUT and OUTB. Feedback transistors 302 and 306 operate as pull-ups that are also controlled by the different portions of the differential output signal. When the differential output signal is high, transistors 306 and 312 are active. When the differential output signal is low, transistors 302 and 314 are active. The result is a feedback loop that maintains the current state on the corresponding nodes while the feedback circuit is selected.

The selection circuit uses transistors 304 and 318 to select between the feedback circuit and the input circuit. These transistors are controlled by the clock signal (CK). When the clock is in a second phase (CK=1) transistor 318 is active and transistor 304 is inactive. When transistor 318 is active, the transistors 312 and 314 will determine which output line is pulled down. In particular, when transistor 318 is active, it provides a pull-down path through whichever of the transistors 316 and 320 is active. The result is that the driving (pull-down) of the differential output signal is independent of the value for differential input because the pull-down path is available regardless of the value. Transistors 312 and 314 control which of the differential output nodes are pulled down based upon the cross coupled feedback. Transistor 304 being inactive prevents transistors 308 and 310, of the input circuit, from pulling up the differential output signal. This also provides independence from the value of the differential input signal.

When the clock is in a first phase (CK=0) transistor 318 is inactive and transistor 304 is active. Transistor 304 being active provides a pull-up path for transistors 308 and 310, of the input circuit. This allows one of these transistors to drive (pull-up) the differential output signal in response to the value of differential input signal. Transistor 318 being inactive results in only transistors 312 and 314 having a pull-down current path. If the value of the input signal has changed from the previous clock cycle, this will result in the pull-down being disabled. For instance, the differential input signal could change from high (1) in the previous clock cycle to low (0) in the present clock cycle. This results in transistor 312 being active, but transistor 316 being inactive. The OUTB node is no longer pulled down. The low differential input signal will result in the input circuit transistor 308 being active, which pulls up OUTB. When OUTB is pulled up, the pull-up provided by feedback circuit transistor 306 is disabled and the pull-down through transistors 314 and 320 is enabled. During a subsequent clock phase (CK=1), the selection circuit allows the feedback circuit to drive the differential output in order to maintain (store) the input value.

Various aspects of the present disclosure are directed toward the recognition that the internal nodes of the depicted master latch circuit do not change state when only the clock changes phases (voltage states). For instance, while the clock phase changes result in different active vs. inactive states for the transistors 318 and 304, the nodes within the master latch circuit remain at the same voltage level states. It is further recognized that the switching state of the transistors in each of the feedback and input circuits do not change when only the clock input changes phases.

Certain aspects of the present disclosure are directed toward the recognition that the logic function depicted in FIG. 2 can be efficiently implemented to save physical real estate on the integrated circuit (IC) die and power from transistor switching. For instance, the selection circuit is designed to provide the gating function of the OR gates with only two transistors (e.g., by sharing pull-down and pull-down paths with the input circuit).

Figure 4:
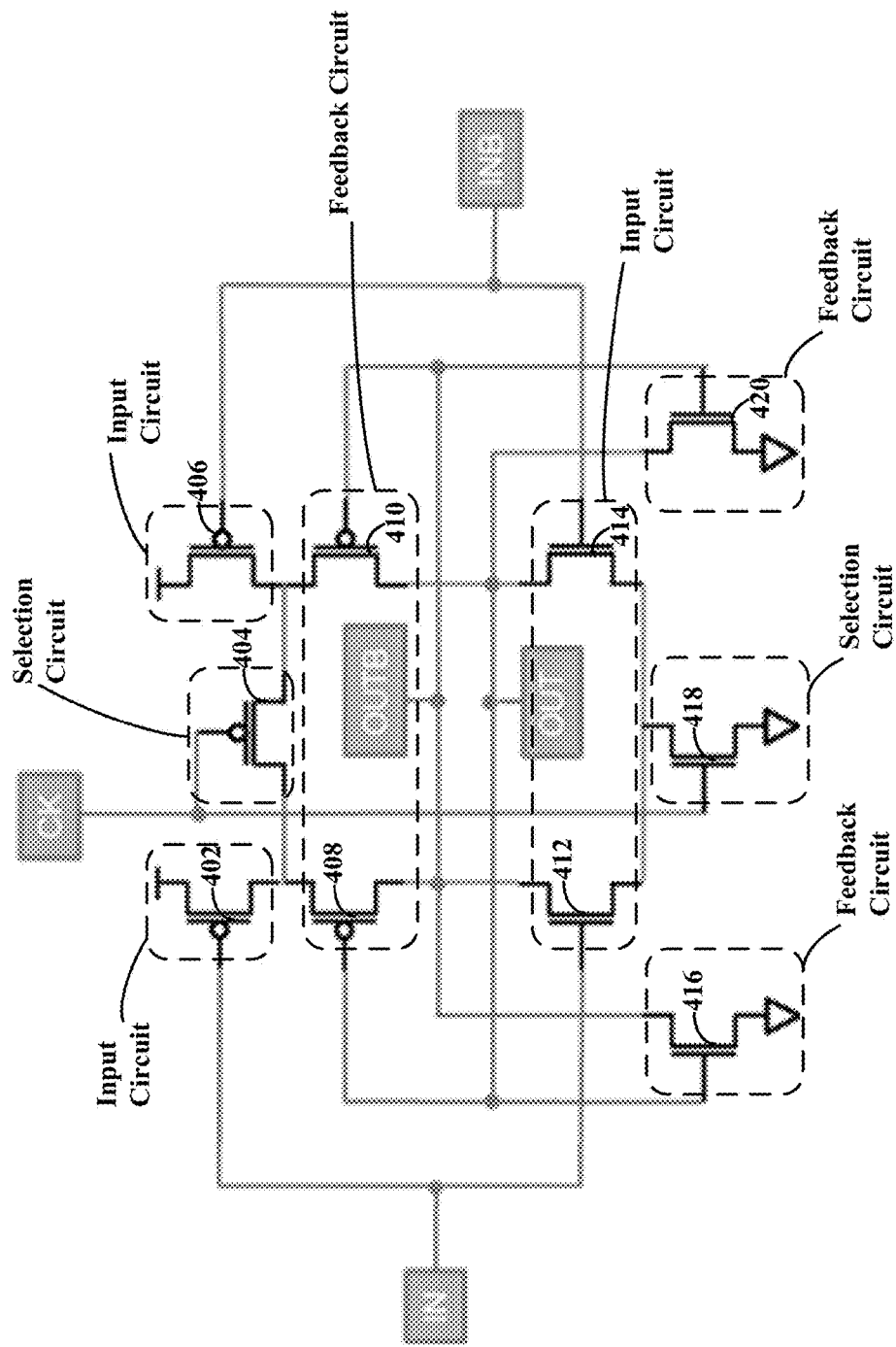
FIG. 4 is a transistor-level diagram for a slave latch circuit, consistent with embodiments of the present disclosure.

FIG. 4 is a transistor-level diagram for a slave latch circuit, consistent with embodiments of the present disclosure. For ease of discussion, the terms IN, INB and OUT, OUTB are (re)used separately with respect to each of the master and slave latch circuit diagrams of FIGS. 3 and 4. In particular, the differential input signal in FIG. 4 is the same node as the differential output signal from FIG. 3. The differential input signal in FIG. 3 is the input to the flip-flop circuit, while the differential output signal in FIG. 4 is the output from the flip-flop circuit.

The depicted slave latch circuit functions much like the master slave latch circuit of FIG. 3, but with inverted function relative to the phase of the clock signal (CK). In particular, the slave latch circuit is transparent when the clock signal is high (CK=1). This corresponds to when the input circuit (transistors 402, 406, 412, 414) is selected to drive the differential output (OUT, OUTB). The slave latch circuit maintains (stores) received data when the clock signal is low (CK=0). This corresponds to when the feedback circuit (transistors 408, 410, 416, 420) is selected.

When the input circuit is selected (CK=1), selection circuit transistor 404 is inactive. This results in the transistors 402 and 406 determining whether the currently-enabled feedback transistor 408 or 410 has a pull-up path. If the value in the differential input signal is the same as the stored value, the enabled transistors will match to maintain the pull-up. For example, if the input and (previous) output differential signals are both high (1), transistors 406 and 410 will both be active resulting in the driving (pull-up) of the OUT signal. If, however, the input signal were low (0) and the (previous) output signal is high (1), transistor 406 will be disabled and OUT will not be pulled-up.

Also when the input circuit is selected (CK=1), selection circuit transistor 418 is active. This provides a pull-down path for either of the input circuit transistors 412, 414. If the input value represents a change from the stored value, the pull-down will change the state for the internal node corresponding to the active transistor (412 or 414). If, however, the input value is the same, the internal node will already be pulled-down by the corresponding feedback circuit transistor (416 or 420).

Much in the same way as discussed in connection with FIG. 3, the circuit of FIG. 4 provides low power by maintaining the (voltage) state of internal nodes when the differential input value does not change. It is further recognized that the switching state of the transistors in each of the feedback and input circuits do not change when only the clock input changes phases. The selection circuit is also efficiently implemented to save physical real estate on the integrated circuit (IC) die and power from transistor switching (e.g., by sharing pull-down and pull-down paths with the input circuit).

Figure 5:
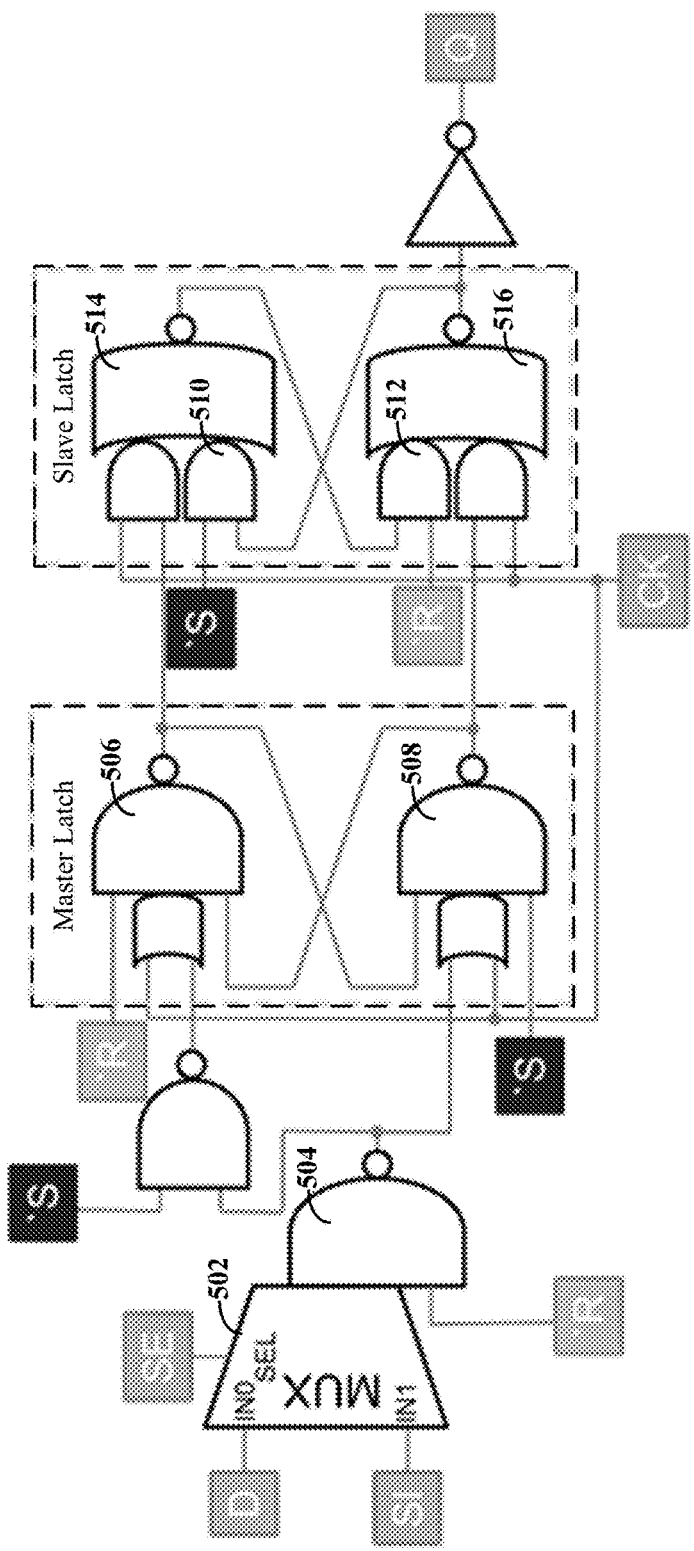
FIG. 5 is a circuit diagram for the binary logic of a flip-flop circuit with additional capabilities, consistent with embodiments of the present disclosure.

FIG. 5 is a circuit diagram for the binary logic of a flip-flop circuit with additional capabilities, consistent with embodiments of the present disclosure. The depicted circuit provides additional scan and set-reset capabilities to the flip-flop circuits discussed herein, including those discussed in connection with FIGS. 1-4. Multiplexer (MUX) 502 allows for selection of the data input to the flip-flop circuit relative to a scan input (SI) and the standard data input (D) in response to a scan enable signal (SE). The scan input can be used for scan chain testing where a plurality of flip-flops are connected in series through corresponding scan inputs (SI).

Set and reset functionality can be provided by adding an additional logic. This includes adding NAND gate 504, adding an additional input port to NAND gates 506 and 508, and gating the cross-coupled inputs to NOR gates 514 and 516 using AND gates 510 and 512, respectively. Although FIG. 5 depicts both scan and set/reset functionality, either functionality can be implemented alone.

Figure 6:
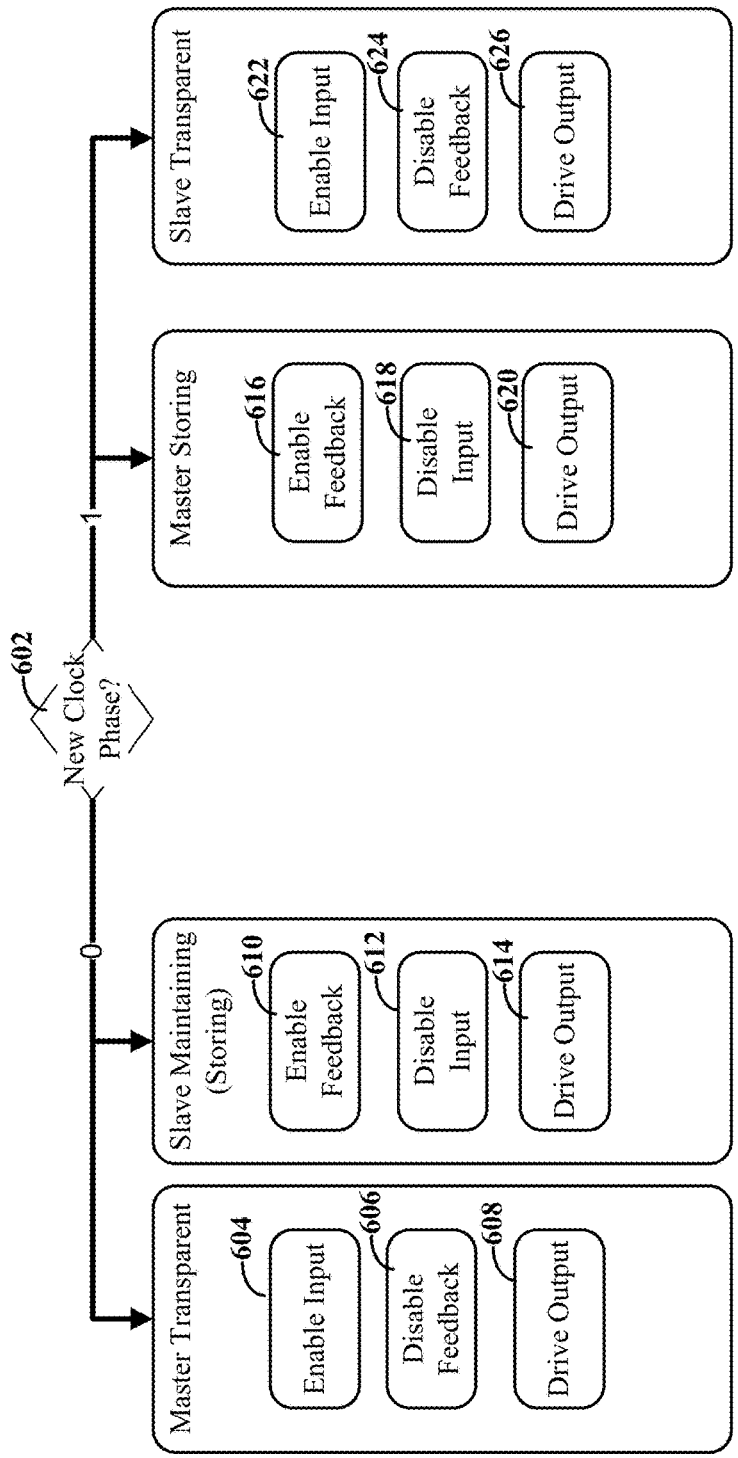
FIG. 6 is a flow diagram for use with a flip flop circuit, consistent with embodiments of the present disclosure.

FIG. 6 is a flow diagram for use with a flip flop circuit, consistent with embodiments of the present disclosure. The flow begins with a new clock phase, per block 602. The new clock phase represents a transition from one voltage level (0 or 1) to another voltage level.

When the clock transition is to a low voltage level (0), the master latch circuit is configured to be transparent to the input of the latch. The transparency is achieved by enabling the input circuit, per block 604 and disabling the feedback circuit, per block 606. The result is that the output of the master latch circuit is driven by the input circuit, per block 608. The slave latch circuit is, at the same time, configured to maintain (or store) the present value. The storing is achieved by enabling the feedback circuit, per block 610, and disabling the input circuit, per block 612. The results is that the output of the slave latch circuit is driven by the feedback circuit, per block 614.

When the clock transition is to a high voltage level (1), the slave latch circuit is configured to be transparent to the input of the latch. The transparency is achieved by enabling the input circuit, per block 622 and disabling the feedback circuit, per block 624. The result is that the output of the slave latch circuit is driven by the input circuit, per block 626. The master latch circuit is, at the same time, configured to maintain (or store) the present value. The storing is achieved by enabling the feedback circuit, per block 616, and disabling the input circuit, per block 618. The results it the output of the master latch circuit is driven by the feedback circuit, per block 620.

Terms that specify orientation, such as upper/lower, left/right, top/bottom and above/below, may be used herein to refer to relative positions of elements as shown in the figures. It should be understood that when the terminology is used for notational convenience, in actual use the disclosed structures may be oriented different from the orientation shown in the figures.

For the purposes of this document, the following terms and definitions apply: latch: a circuit that can be used to store data in one of the two stable states of the circuit; flip-flop: a circuit that can be used to store data in one of the two stable states of the circuit in response to an edge of a clock signal; and latch: a circuit that that can be used to store data in one of the two stable states of the circuit.

The Specification describes and/or illustrates aspects useful for implementing the claimed invention(s) by way of various circuits or circuitry which may be discussed using terms such as blocks, modules, device, system, unit, controller, and/or other terms. Such circuits or circuitry are used together with other elements and are described with respect to their structures, steps, functions, operations, activities, etc. For example, in certain of the above-discussed embodiments, one or more illustrated items in this context represent circuits (e.g., discrete logic circuitry or (semi-)programmable circuits) configured and arranged for implementing these operations/activities, as may be carried out in the approaches shown and discussed in connection with the figures.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the logic of the master and slave latches can be inverted to create a negative-edge triggered flip-flop. Such modifications do not depart from the true spirit and scope of various aspects of the disclosure, including aspects set forth in the claims.

What is claimed is:

1. An apparatus comprising:
    circuitry configured to store data in response to a phase transition of an input clock, the circuitry including:
        a master latch including:
            a master feedback circuit configured to drive an output of the master latch to a value that is responsive to data stored in the master latch;
            a master input circuit configured to drive the output of the master latch to a value that is responsive to data on an input of the master latch; and
            a master selection circuit configured to:
                select, in response to a first phase of the input clock, the master input circuit to drive the output of the master latch; and
                select, in response to a second phase of the input clock, the master feedback circuit to drive the output of the master latch; and
        a slave latch including:
            a slave feedback circuit configured to drive an output of the slave latch to a value that is responsive to data stored in the slave latch;
            a slave input circuit configured to drive the output of the slave latch to a value that is responsive to data on the output of the master latch; and
            a slave selection circuit configured to:
                select, in response to the first phase of the input clock, the slave feedback circuit to drive the output of the slave latch; and
                select, in response to the second phase of the input clock, the slave input circuit to drive the output of the slave latch, wherein the master selection circuit is configured and arranged to, when the input of the master latch is a differential signal, select the master input circuit to drive the output of the master latch as a first phase of an output differential signal in response to a first phase of the differential signal, and to select the master feedback circuit to drive the output of the master latch as a second phase of the output differential signal.

2. The apparatus of claim 1, wherein master input circuit includes:
    a first pair of transistors with gates connected to a first signal of the differential signal for the input of the master latch, and
    a second pair of transistors with gates connected to a second signal of the differential signal for the input of the master latch.

3. The apparatus of claim 2, wherein the master selection circuit includes:
    a first transistor that connects a first one of the first pair of transistors and a first one of the second pair of transistors to a supply voltage, and
    a second transistor that connects a second one of the first pair of transistors to a second one of the second pair of transistors.

4. The apparatus of claim 1, wherein the master feedback circuit includes:
    a first pair of transistors with gates connected to a first signal of the differential signal for the output of the master latch, and
    a second pair of transistors with gates connected to a second signal of the differential signal for the output of the master latch.

5. The apparatus of claim 1, wherein the circuitry includes set and reset logic configured to set and reset a value stored in the circuitry.

6. The apparatus of claim 1, wherein the slave selection circuit includes two transistors configured to operate as a logical equivalent of two AND logic gates providing an input to respective NOR logic gates of the slave input circuit.

7. An apparatus comprising:
    circuitry configured to store data in response to a phase transition of an input clock, the circuitry including:
        a master latch including:
            a master feedback circuit configured to drive an output of the master latch to a value that is responsive to data stored in the master latch;
            a master input circuit configured to drive the output of the master latch to a value that is responsive to data on an input of the master latch; and
            a master selection circuit configured to:
                select, in response to a first phase of the input clock, the master input circuit to drive the output of the master latch; and
                select, in response to a second phase of the input clock, the master feedback circuit to drive the output of the master latch; and
        a slave latch including:
            a slave feedback circuit configured to drive an output of the slave latch to a value that is responsive to data stored in the slave latch;
            a slave input circuit configured to drive the output of the slave latch to a value that is responsive to data on the output of the master latch; and
            a slave selection circuit configured to:
                select, in response to the first phase of the input clock, the slave feedback circuit to drive the output of the slave latch; and
                select, in response to the second phase of the input clock, the slave input circuit to drive the output of the slave latch, wherein the output of the master latch is a differential signal and slave input circuit includes:
    a first pair of transistors with gates connected to a first signal of the differential signal, and
    a second pair of transistors with gates connected to a second signal of the differential signal for the output of the master latch.

8. The apparatus of claim 7, wherein the slave selection circuit includes:
    a first transistor that connects a first one of the first pair of transistors and a first one of the second pair of transistors to a common voltage, and
    a second transistor that connects a second one of the first pair of transistors to a second one of the second pair of transistors.

9. An apparatus comprising:
    circuitry configured to store data in response to a phase transition of an input clock, the circuitry including:
        a master latch including:

a master feedback circuit configured to drive an output of the master latch to a value that is responsive to data stored in the master latch;

a master input circuit configured to drive the output of the master latch to a value that is responsive to data on an input of the master latch; and a master selection circuit configured to:
select, in response to a first phase of the input clock, the master input circuit to drive the output of the master latch; and
select, in response to a second phase of the input clock, the master feedback circuit to drive the output of the master latch; and a slave latch including:
a slave feedback circuit configured to drive an output of the slave latch to a value that is responsive to data stored in the slave latch;
a slave input circuit configured to drive the output of the slave latch to a value that is responsive to data on the output of the master latch; and
a slave selection circuit configured to:
select, in response to the first phase of the input clock, the slave feedback circuit to drive the output of the slave latch; and
select, in response to the second phase of the input clock, the slave input circuit to drive the output of the slave latch, wherein the output of the slave latch is a differential signal and the slave feedback circuit includes:

a first pair of transistors with gates connected to a first signal of the differential signal for the output of the slave latch, and a second pair of transistors with gates connected to a second signal of the differential signal for the output of the slave latch.

10. An apparatus comprising:
circuitry configured to store data in response to a phase transition of an input clock, the circuitry including:
a master latch including:
a master feedback circuit configured to drive an output of the master latch to a value that is responsive to data stored in the master latch;
a master input circuit configured to drive the output of the master latch to a value that is responsive to data on an input of the master latch; and
a master selection circuit configured to:
select, in response to a first phase of the input clock, the master input circuit to drive the output of the master latch; and
select, in response to a second phase of the input clock, the master feedback circuit to drive the output of the master latch; and a slave latch including:
a slave feedback circuit configured to drive an output of the slave latch to a value that is responsive to data stored in the slave latch;
a slave input circuit configured to drive the output of the slave latch to a value that is responsive to data on the output of the master latch; and
a slave selection circuit configured to:
select, in response to the first phase of the input clock, the slave feedback circuit to drive the output of the slave latch; and
select, in response to the second phase of the input clock, the slave input circuit to drive the output of the slave latch, wherein the master selection circuit includes two transistors configured to operate as a logical equivalent of two OR logic gates providing an input to respective NAND logic gates of the master input circuit.

11. A method comprising:
operating circuitry that includes a master latch circuit and a slave latch circuit by:
enabling, in response a first clock phase of an input clock and using an master selection circuit of the master latch circuit, a master input circuit;
driving, using the enabled master input circuit, an output of the master latch circuit to a value that is responsive to data present on an input to the master latch circuit;
disabling, in response the first clock phase of the input clock and using a slave selection circuit of the slave latch circuit, a slave input circuit;
maintaining, using a slave feedback circuit of the slave latch circuit, an output of the slave latch circuit;
disabling, in response a second clock phase of the input clock and using the master selection circuit, the master input circuit;
maintaining, using a master feedback circuit of the master latch circuit, the output of the master latch circuit;
enabling, in response the second clock phase of the input clock and using the slave selection circuit, the slave input circuit; and
driving, using the enabled slave input circuit, the output of the slave latch circuit to a value that is responsive to a value present on the output of the master latch circuit, wherein the slave selection circuit includes two transistors configured to operate as a logical equivalent of two AND logic gates providing an input to respective logic gates of the slave input circuit each of which is configured to operate as a logical equivalent of a NOR gate.

12. The method of claim 11, further comprising conserving power drawn by the circuitry by maintaining a switching state for each transistor in at least one of the slave feedback circuit and the master feedback circuit during a phase transition of the input clock.

13. The method of claim 11, further comprising conserving power drawn by the circuitry by maintaining, during a phase transition of the input clock, a switching state for each transistor in at least one of the master input circuit and the slave input circuit.

14. The method of claim 11, further comprising setting a value stored in the circuitry to a first predetermined value in response to a set signal.

15. The method of claim 14, further comprising resetting the value stored in the circuitry to a second predetermined value in response to a reset signal.

16. The method of claim 11, further comprising selecting between an internal input and a scan input and providing the selected input to the input of the master latch circuit.

17. The method of claim 11, further comprising conserving power drawn by the circuitry by maintaining a state for all signals in the master selection circuit and the slave selection circuit when there is a change in state of the input clock and not a corresponding change of state to the input to the master latch circuit.

* * * * *